(12) United States Patent
Palmteer

(10) Patent No.: US 7,595,453 B2
(45) Date of Patent: Sep. 29, 2009

(54) SURFACE MOUNT PACKAGE

(75) Inventor: William Palmteer, Andover, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 245 days.

(21) Appl. No.: 11/136,249

(22) Filed: May 24, 2005

(65) Prior Publication Data

US 2006/0266546 A1    Nov. 30, 2006

(51) Int. Cl.
    *H05K 1/03*    (2006.01)
(52) U.S. Cl. .................................. 174/255; 174/260
(58) Field of Classification Search ................ 174/255, 174/260; 257/704, 707, 774
See application file for complete search history.

(56) References Cited

U.S. PATENT DOCUMENTS

| | | | |
|---|---|---|---|
| 4,737,236 A | 4/1988 | Perko et al. | |
| 5,268,310 A | 12/1993 | Goodrich et al. | |
| 5,343,070 A | 8/1994 | Goodrich et al. | |
| 5,502,317 A | 3/1996 | Duvvury | |
| 5,696,466 A | 12/1997 | Li | |
| 5,698,866 A * | 12/1997 | Doiron et al. | 257/99 |
| 5,838,093 A * | 11/1998 | Sakai et al. | 310/348 |
| 5,841,184 A | 11/1998 | Li | |
| 5,877,037 A | 3/1999 | O'Keefe et al. | |
| 5,914,501 A | 6/1999 | Antle et al. | |
| 5,976,941 A | 11/1999 | Boles et al. | |
| 6,014,064 A | 1/2000 | Boles et al. | |
| 6,114,716 A | 9/2000 | Boles et al. | |
| 6,150,197 A | 11/2000 | Boles et al. | |
| 6,191,048 B1 | 2/2001 | Ressler et al. | |
| 6,310,395 B1 * | 10/2001 | Takahashi et al. | 257/735 |
| 6,379,785 B1 | 4/2002 | Ressler et al. | |
| 6,472,688 B2 | 10/2002 | Miyata | |
| 6,486,499 B1 | 11/2002 | Krames et al. | |
| 6,521,914 B2 | 2/2003 | Krames | |
| 6,593,598 B2 | 7/2003 | Ishinaga | |
| 6,627,987 B1 * | 9/2003 | Glenn et al. | 257/704 |
| 6,642,072 B2 | 11/2003 | Inoue et al. | |
| 6,642,550 B1 | 11/2003 | Whitworth et al. | |
| 6,876,008 B2 | 4/2005 | Bhat et al. | |
| 7,055,987 B2 * | 6/2006 | Staufert | 362/252 |
| 7,227,750 B2 * | 6/2007 | Chen et al. | 361/688 |
| 7,241,030 B2 * | 7/2007 | Mok et al. | 362/294 |
| 2001/0038140 A1 * | 11/2001 | Karker et al. | 257/666 |
| 2002/0175621 A1 * | 11/2002 | Song et al. | 313/515 |
| 2003/0085416 A1 | 5/2003 | Brogle et al. | |
| 2004/0184270 A1 | 9/2004 | Halter | |
| 2005/0269695 A1 | 12/2005 | Brogle et al. | |
| 2006/0027826 A1 | 2/2006 | Goodrich | |
| 2007/0076381 A1 * | 4/2007 | Han et al. | 361/749 |

OTHER PUBLICATIONS

D.A. Steigerwald et al., Illumination with Solid State Lighting Technology, IEEE Journal on Selected Topics in Quantum Electronics, vol. 8, No. 2, Mar./Apr. 2002 (11 pgs.).

Glenn Zorpette, Let There Be Light, IEEE Spectrum, Sep. 2002 (5 pgs.).

* cited by examiner

*Primary Examiner*—Dean A. Reichard
*Assistant Examiner*—Yuriy Semenenko
(74) *Attorney, Agent, or Firm*—Christopher P. Maiorana, PC

(57) ABSTRACT

A surface mount package is provided that includes a first metal layer and a second metal layer configured to be electrically connected to the first metal layer. The surface mount package further includes a ceramic layer between the first and second metal layers. The ceramic layer has an opening therethrough.

3 Claims, 4 Drawing Sheets

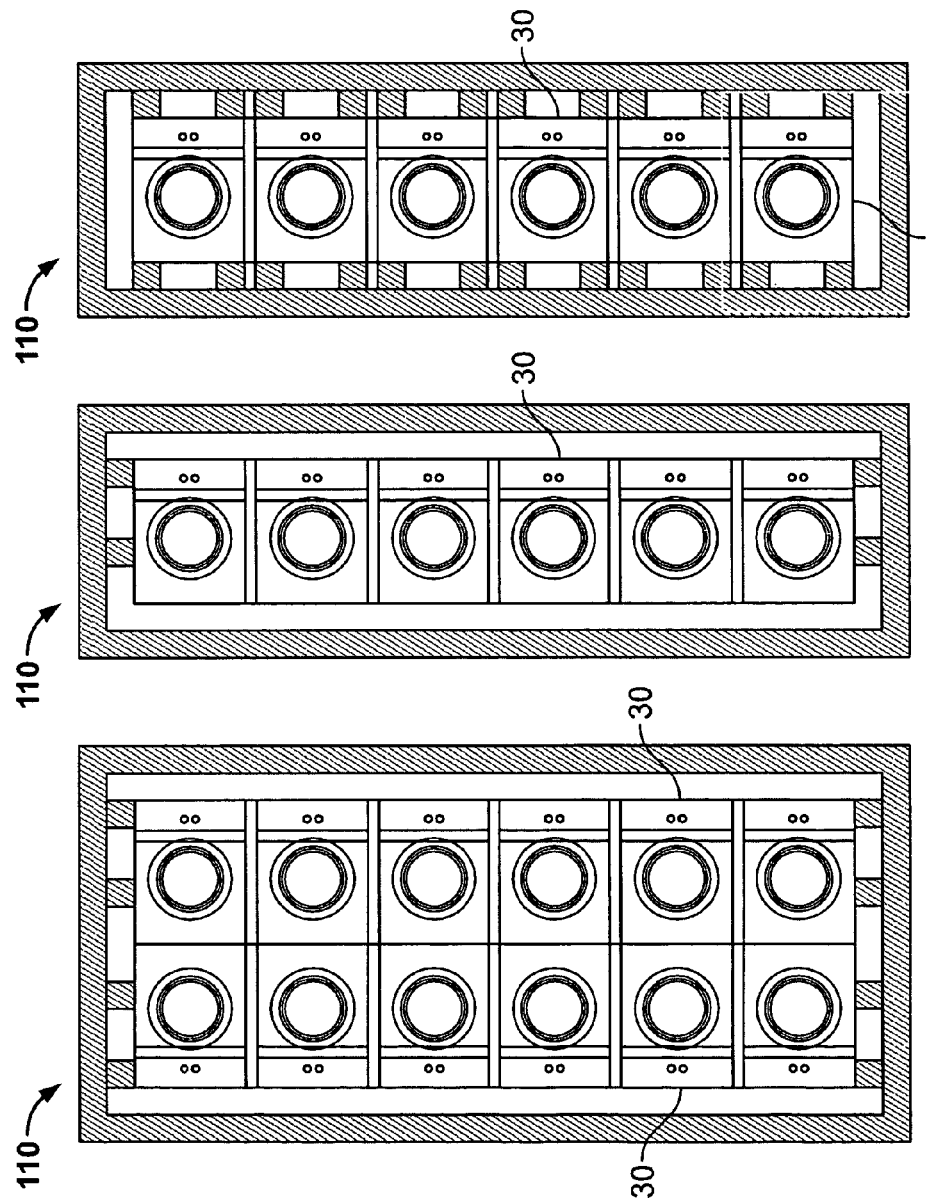

SURFACE MOUNT PACKAGE

BACKGROUND OF THE INVENTION

This invention relates generally to surface mount packages, and more particularly, to surface mount packages for two terminal devices such as diodes.

Surface mount components or devices, and in particular, the use of surface mount packages allow smaller footprint designs with improved functionality and increased mounting densities. For example, Integrated Circuit (IC) mounting methods using surface mounting allow mounting of packages on both sides of, for example, a printed wiring board, thereby resulting in higher density mounting and reduced wire board size as compared to through-hole mounting. These surface mount packages also are becoming increasingly smaller and thinner to further provide this higher density mounting.

Surface mount packages include different isolated paths for electrical current flow, for example, to an anode and cathode within the packages. Plastic is often used to form the surface mount package and may be used to isolate the current flow. These surface mount packages are commonly referred to as plastic packages. Separate metal connection pads may be used to provide electrical connection to the anode and cathode. Further, vias, other conduits or sidewall metallization may be included to provide electrical and/or thermal continuity between top metal connection pads and backside metal connection pads of the surface mount package.

These surface mount packages may be used to mount thereon different types of two terminal devices, such as, for example, diodes, and more particularly, light emitting diodes (LEDs). However, operation of some of these two terminal devices generates high levels of heat. Plastic packages may not provide acceptable levels of thermal dissipation for some of these devices and for certain applications. For example, certain high power devices may require thermal dissipation at levels higher than can be provided using these plastic packages. Further, because plastic has a relatively high thermal resistance, the efficiency of devices mounted within these packages may be reduced.

Additionally, it is difficult, if not impossible, to seal the plastic packages for certain applications, for example, to hermetically seal the plastic packages. This is because at the higher temperatures needed to hermetically seal the package (e.g., 300-400 degrees Celsius solder temperature), the plastic packages can melt.

Thus, these plastic packages may not be suitable for certain applications and further may not provide acceptable operating characteristics.

BRIEF DESCRIPTION OF THE INVENTION

According to an exemplary embodiment, a surface mount package is provided that includes a first metal layer and a second metal layer configured to be electrically connected to the first metal layer. The surface mount package further includes a ceramic layer between the first and second metal layers. The ceramic layer has an opening therethrough.

According to another exemplary embodiment, a surface mount package is provided that includes a first lead frame and a second lead frame configured to be electrically connected to the first lead frame. The surface mount package further includes a ceramic layer between the first and second lead frames. The ceramic layer is configured to electrically isolate a positive side and a negative side of the lead frames.

According to yet another exemplary embodiment, a method for manufacturing a surface mount package is provided. The method includes providing a first metal layer and providing a second metal layer electrically connected to the first metal layer. The method further includes providing a ceramic layer between the first and second metal layers. The ceramic layer has an opening therethrough and is configured to electrically isolate a positive side from a negative side of the surface mount package.

BRIEF DESCRIPTION OF THE DRAWINGS

FIGS. 7A-7C are top plan views of arrays of surface mount packages constructed in accordance with exemplary embodiments of the invention.

DETAILED DESCRIPTION OF THE INVENTION

Figure 1A:
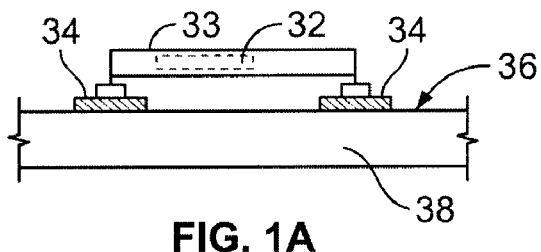
FIGS. 1A and 1B are elevation views of various embodiments illustrating surface mounting of surface mount devices.
Figure 1B:
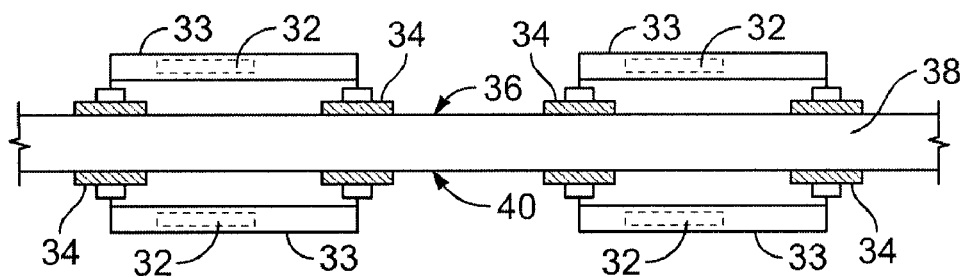

FIG. 1A is a side elevation view of a surface mount arrangement wherein a surface mount device 32 (e.g., a diode) within a surface mount package 33 is mounted, for example, to a printed wiring board 38. More particularly, the surface mount device 32 is mounted to mounting portions, for example, solder paste portions 34 on a top surface 36 of the printed wiring board 38. Further, and as shown in FIG. 1B, surface mount devices 32 may be mounted to both the top surface 36 and a bottom surface 40 of the printed wiring board 38.

Figure 2:
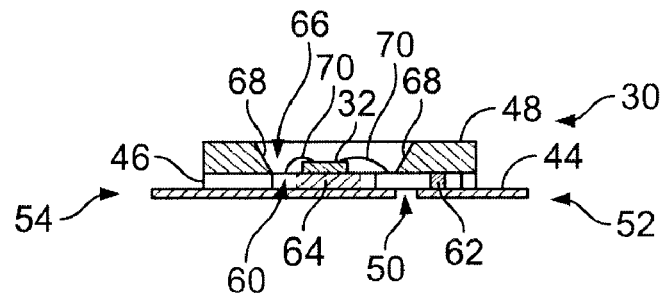
FIG. 2 is a cross-sectional elevation view of a surface mount package constructed in accordance with an exemplary embodiment of the invention.
Figure 3:
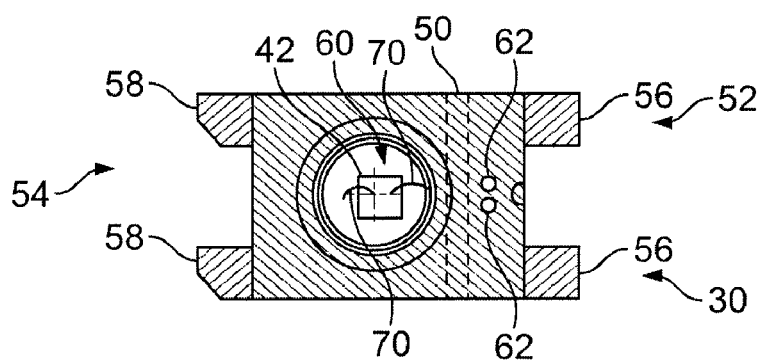
FIG. 3 is a top plan view of the surface mount package of FIG. 2.

Various embodiments of the present invention provide a surface mount package. In an exemplary embodiment, as shown in FIGS. 2 and 3, a surface mount package 30 generally includes a plurality of layers forming the surface mount package 30 and for mounting a surface mount device 32 thereto. Specifically, the surface mount package includes a first layer 44 (e.g., a first metal layer), which in this embodiment is a metal lead frame, a second layer 46, which in this embodiment is a ceramic layer, and a third layer 48, which in this embodiment is another metal lead frame. More particularly, the first layer 44, includes a gap, groove or channel 50 formed (e.g., etched) thereon to electrically isolate an input side or positive side 52 and an output side or negative side 54 of the surface mount package 30. Specifically, and as shown in FIG. 3, the input side 52 includes a plurality of anodes 56 formed as part of the first layer 44 and the output side 54 includes a plurality of cathodes 58 formed as part of the first layer 44.

In an exemplary embodiment, the first layer 44 is formed of a metal such as copper, Kovar, or other metal alloy (e.g., nickel), or a combination thereof. In general, the first layer 44 is formed as an etched lead frame constructed of any suitable electrically conducting material. In the exemplary embodiment, the second layer 46 is formed of a ceramic material, for example, alumina, calcia, beryllium oxide, aluminum nitride, silicon nitride, or other suitable ceramic material. The second layer 46 is provided on top of the first layer 44, using any known and suitable process, for example, using a brazing process. The second layer 46 includes an opening 60 extending therethrough (e.g., a cutout portion). In this exemplary embodiment, the opening 60 is configured in a circular shape and provides access therethrough to the first layer 44. Additionally a plurality of vias 62 (e.g., two vias) are provided through the second layer 46, which in one embodiment, are metal filled vias 62 configured to provide electrical connection and connectivity between the first layer 44 and the third layer 48. For example, the vias 62 provide for connecting the surface mount device 32 to the anodes 56 of the first layer 44. Additional or fewer vias 62 may be provided. Additionally, a metal portion 64 extending generally perpendicularly from the first layer 44 may be provided (e.g., formed thereon) for mounting the surface mount device 32 thereto and for raising the surface mount device 32 above the second layer 46. However, as should be appreciated, the metal portion 64 may be removed with the surface mount device 32 mounted directly to the first layer 44.

A top and bottom surface of the second layer 46 may be metallized, using any known process, for example, refractory metallization, to provide electrical and thermal conductivity with the third and first layers 48 and 44, respectively. Various metals may be used for metallization, including, for example, silver.

In this exemplary embodiment, the third layer 48 (e.g., a second metal layer) is also formed of a metal such as copper, Kovar, or other metal alloy (e.g., nickel), or a combination thereof. In general, the third layer 48 is formed as an etched lead frame constructed of any suitable electrically conducting material and provided on top of the second layer 46 using any known and suitable process, for example, using a brazing process. The third layer 48 also includes an opening 66 that may be configured to receive therein or therethrough the surface mount device 32. For example, the third layer 48 may be configured to form a frame structure surrounding a surface mount device 32 mounted in a cavity therein. As shown in FIG. 3, the surface mount device 32 is mounted approximately in the center of the cavity.

The frame structure may be configured having angled inner walls 68 that include a reflective surface for redirecting and focusing light emitted from a surface mount device 32 therein, and more particularly, a light emitting diode (LED). More particularly, the angled walls 68 may be formed from a reflective silicon (e.g., etched in a silicon wafer). In an exemplary embodiment, the angled walls 68 are etched at an angle of approximately 60 degrees. An example of a light emitting diode package having angled walls is described in co-pending and commonly owned U.S. patent application entitled "Light Emitting Diode Package" having Ser. No. 10/914,361. It should be noted that the first and second layers 44 and 46 may define a submount portion with a frame portion defined by the third layer 48 provided on top thereof.

The surface mount device 32 is connected to the input and output sides 52 and 54 (e.g., positive and negative sides) using, for example, wire bonds 70 as is known. Specifically, a wire bond 70 may be connected from a terminal (e.g., positive terminal) of the surface mount device 32 to a metal pad (not shown) formed on the second layer 46 for connection to the anodes 56 through the vias 62. For example, the metal pads may be provided as part of the vias 62. Another wire bond 70 may be connected from another terminal (e.g., negative terminal) of the surface mount device 32 through the opening 60 of the second layer 46 to the negative side 54 of the first layer 44.

Figure 4:
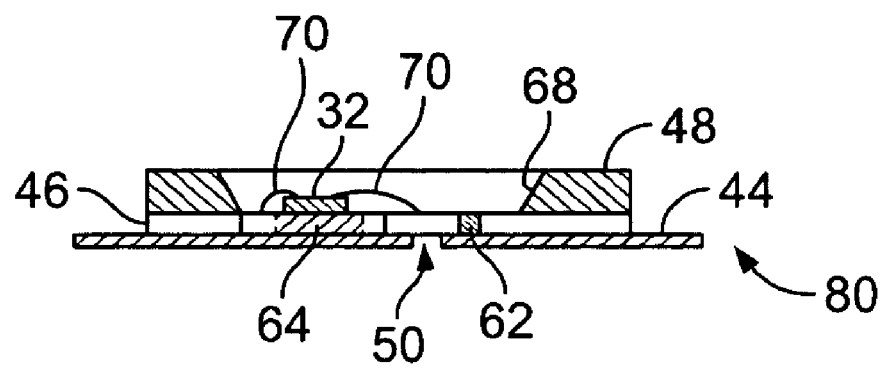
FIG. 4 is a cross-sectional elevation view of a surface mount package constructed in accordance with another exemplary embodiment of the invention.
Figure 5:
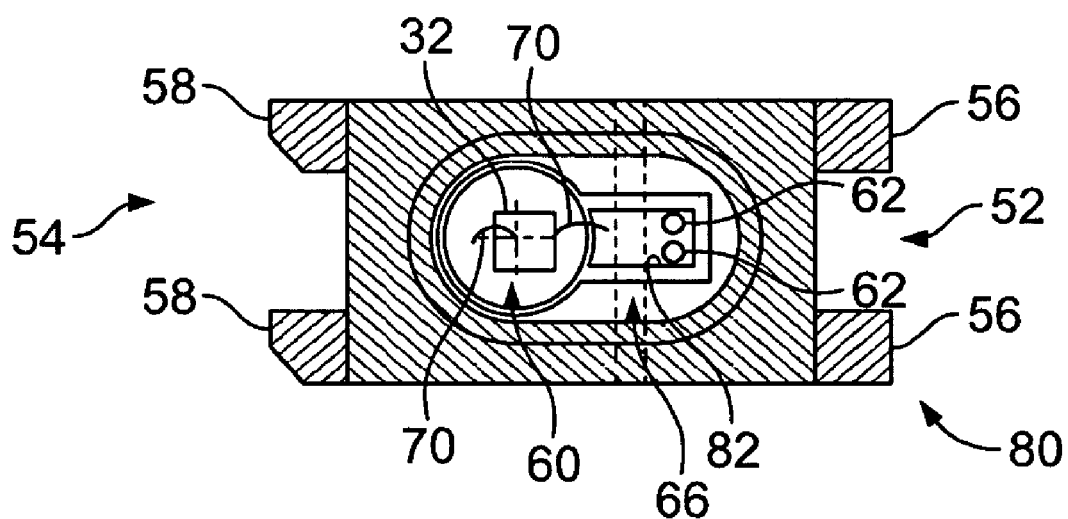
FIG. 5 is a top plan view of the surface mount package of FIG. 4.

It should be noted that the openings 60 and 66 may be configured in different shapes. For example, as shown in FIGS. 4 and 5, a surface mount package 80 may be provided such that the opening 60 is configured in a circular shape and the opening 66 is configured in an oval shape. A metal pad 82 may be provided and formed as part of the vias 62 as described in more detail herein. Thus, the surface mount device 32 may be mounted off center within the opening 66.

Figure 6:
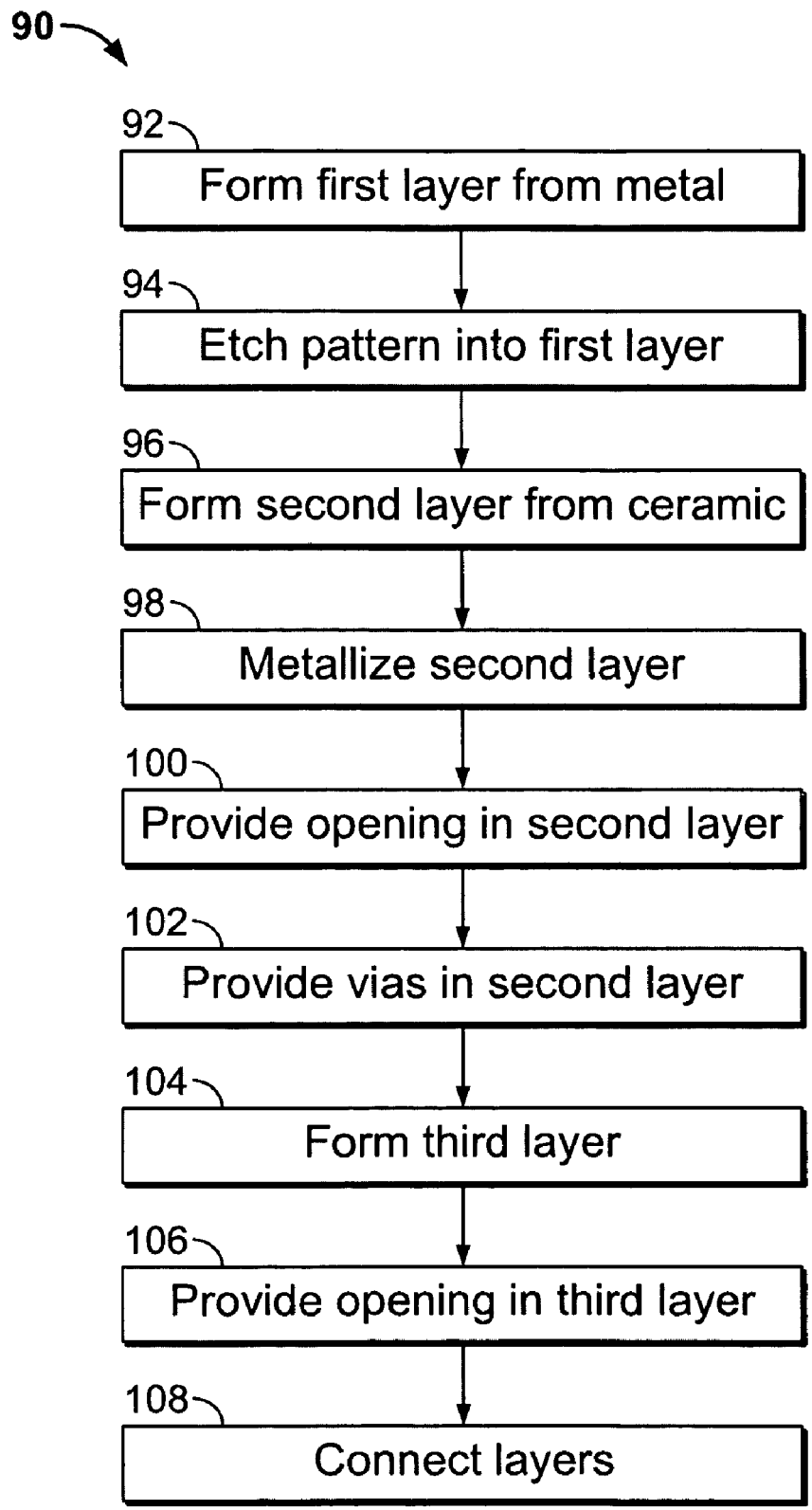
FIG. 6 is a flowchart illustrating a process for manufacturing a surface mount package in accordance with an exemplary embodiment of the invention.

An exemplary process 90 for manufacturing a surface mount package 30 is shown in FIG. 6. Specifically, at 92, a first layer is formed, for example, a metal lead frame is formed (e.g., cut) from a piece of metal. A pattern is then etched or cut into the first layer at 94. This may include, for example, providing connection members, such as, anodes and cathodes to the lead frame and providing a gap, groove or channel between the anodes and cathodes to electrically isolate an input and output that may be provided by the anode and cathode, respectively. Additionally, a metal portion may be formed on top of the first layer for later mounting thereon of a surface mount device as described in more detail herein. Thereafter, at 96, a second layer is formed, for example, a ceramic layer is formed. The second layer is metallized at 98, and more particularly, a top and bottom surface of the second layer is metallized.

At 100, an opening is provide (e.g., cut) in the second layer and configured to receive therein a surface mount device or the metal portion of the first layer. Thereafter, vias or conduits are provided (e.g., cut) in the second layer at 102. These vias may be metal filled to provide electrical and thermal connection through the second layer. Additionally, metal pads may be formed as part of and on top of the metal filled vias. At 104, a third layer is formed, for example, another metal lead frame is formed (e.g., cut) from a piece of metal. A pattern is then etched or cut into the third layer, and more particularly, at 106 an opening is provided (e.g., cut) therein for receiving a surface mount device. The opening may be formed having reflective angled walls as described herein.

At 108, the three layers are connected, for example, by brazing with silver at 400 degrees Celsius or higher. Alternatively, the layers may be bonded together, for example, using a polymer or adhesive (e.g., BCB). The three layers thereby form a surface mount package that may be used to mount a surface mount device therein, for example, a surface mount diode, such as an LED or Zener diode. The surface mount device may be connected to the surface mount package using wire bonds as is known. The surface mount package may then be connected or mounted, for example, to a printed wiring board.

It should be noted that the process 90 may be modified, for example, the steps described may be performed in a different order as desired or needed. For example, the first two layers may be connected before forming the third layer. Additionally, the methods of forming and cutting the layers may be provided using any known process as desired or needed.

It should be noted that a plurality of surface mount packages 30 may be formed as an array 110 as shown in FIGS. 7A-7C having different configurations. The surface mount packages 30 may be aligned in series or parallel as shown and as desired or needed.

Thus, a surface mount package for a surface mount device (e.g., surface mount LED) is provided. The surface mount package generally includes a ceramic layer between two metal layers, without the use of plastic. The surface mount package allows use in a wider range of applications.

While the invention has been described in terms of various specific embodiments, those skilled in the art will recognize that the invention can be practiced with modification within the spirit and scope of the claims.

What is claimed is:

1. A surface mount package comprising:
a first lead frame;
a second lead frame configured to be electrically connected to the first lead frame and forming a metal frame structure having a cavity for receiving therein a surface mounted device; and
a ceramic layer between the first and second lead frames, the ceramic layer configured to electrically isolate a positive side and a negative side of the lead frames.

2. A surface mount package in accordance with claim 1 further comprising an opening in the second lead frame and a corresponding opening in the ceramic layer.

3. A surface mount package in accordance with claim 1 wherein the first lead frame comprises a gap configured to electrically isolate the positive side and the negative side of the lead frames.

* * * * *